United States Patent
Adams et al.

(10) Patent No.: US 9,655,275 B2
(45) Date of Patent: May 16, 2017

(54) RACK ASSEMBLIES FOR SERVER CARRYING AND PIVOTING

(71) Applicant: Lenovo Enterprise Solutions (Singapore) Pte. Ltd., New Tech Park (SG)

(72) Inventors: Keith T. Adams, Cary, NC (US); Gary D. Cudak, Wake Forest, NC (US); Joseph F. Herman, Wake Forest, NC (US); John M. Weber, Morrisville, NC (US)

(73) Assignee: Lenovo Enterprise Solutions (Singapore) Pte. Ltd., Serangoon Garden (SG)

( * ) Notice: Subject to any disclaimer, the term of this patent is extended or adjusted under 35 U.S.C. 154(b) by 0 days.

(21) Appl. No.: 14/848,706

(22) Filed: Sep. 9, 2015

(65) Prior Publication Data
US 2017/0071072 A1    Mar. 9, 2017

(51) Int. Cl.
*H05K 7/14*    (2006.01)
*H05K 7/18*    (2006.01)

(52) U.S. Cl.
CPC ........... *H05K 7/1489* (2013.01); *H05K 7/183* (2013.01)

(58) Field of Classification Search
CPC ...... H05K 7/16; H05K 7/1488; H05K 7/1485; H05K 7/183; H05K 7/1425; H05K 5/0021; H05K 5/0226; A47B 88/06
USPC .................... 211/26; 312/312–316, 321–323
See application file for complete search history.

(56) References Cited

U.S. PATENT DOCUMENTS

| | | | | |
|---|---|---|---|---|
| 1,949,118 A | * | 2/1934 | Earley | A47B 21/03 312/29 |
| 2,519,632 A | * | 8/1950 | Brinker | B42F 17/18 312/323 |
| 3,148,007 A | * | 9/1964 | Bertrand | H05K 7/16 312/323 |
| 3,356,432 A | * | 12/1967 | Mariotte | A47B 88/06 312/298 |
| 3,641,705 A | * | 2/1972 | Schmidlin | E05D 15/581 49/256 |
| 4,258,967 A | * | 3/1981 | Boudreau | H05K 7/1421 312/273 |
| 5,169,221 A | * | 12/1992 | Wheeler | A47B 88/06 16/358 |
| 5,375,534 A | * | 12/1994 | Adams | B60P 7/135 105/372 |

(Continued)

*Primary Examiner* — Patrick Hawn
(74) *Attorney, Agent, or Firm* — Olive Law Group, PLLC

(57) ABSTRACT

Rack assemblies for server carrying and pivoting are disclosed. According to an aspect, a rack assembly includes a server rack including multiple stand columns. The server rack defines server spaces for receiving servers, and defines an opening for access of the server spaces. The rack assembly includes first and second slide rails supported by the stand columns and configured to move between a first position within a server spaces and a second position that is outside of the opening. Further, the rack assembly includes a first connector being configured to releasably attach a first side of the server to the first slide rail. The rack assembly also includes a second connector configured to attach the second side to the second slide rail, and configured to pivot about the second side when the first side is detached from the second slide rail.

19 Claims, 10 Drawing Sheets

(56) References Cited

U.S. PATENT DOCUMENTS

| | | | | |
|---|---|---|---|---|
| 6,169,249 | B1* | 1/2001 | Teachout | H05K 7/1421 174/559 |
| 6,814,244 | B1* | 11/2004 | Hathcock | E05D 15/502 211/26 |
| 7,258,568 | B2* | 8/2007 | Shih | H05K 7/1494 211/26 |
| 7,277,273 | B2* | 10/2007 | Smith | H05K 7/1488 211/26 |
| 7,527,155 | B2* | 5/2009 | McClain | G06F 1/181 211/126.2 |
| 7,836,549 | B1* | 11/2010 | McGuigan | E05D 7/1072 16/266 |
| 8,388,075 | B2* | 3/2013 | Sun | H05K 7/1489 312/310 |
| 8,437,123 | B2* | 5/2013 | Sun | H05K 7/1489 312/311 |
| 8,696,075 | B1* | 4/2014 | Rios | A47F 10/06 126/25 R |
| 2004/0232810 | A1* | 11/2004 | Kreyenkamp | A47B 88/06 312/322 |
| 2005/0173357 | A1* | 8/2005 | McClain | G06F 1/181 211/26 |
| 2011/0210654 | A1* | 9/2011 | Edison Zatz | A47B 88/06 312/327 |
| 2011/0279956 | A1* | 11/2011 | Sun | H05K 7/1489 361/679.02 |
| 2013/0039004 | A1 | 2/2013 | Li et al. | |

* cited by examiner

RACK ASSEMBLIES FOR SERVER CARRYING AND PIVOTING

TECHNICAL FIELD

The presently disclosed subject matter relates to rack assemblies. More specifically, the presently disclosed subject matter relates to rack assemblies for server carrying and pivoting.

BACKGROUND

Servers are computing devices that operate within a client-server architecture. Such computing devices serve the requests of other computing devices or programs, referred to as clients. Servers may share data, information, or hardware with their clients. Example servers include a database server, a file server, a mail server, a print server, a web server, a gaming server, and an application server. Oftentimes, multiple servers will be collected and operate together in a server farm or cluster.

Servers in a server farm are typically stored in a rack, which is a frame or enclosure for mounting multiple servers. Multiple racks may be arranged in rows so that the servers can be conveniently accessed by personnel for server operation and maintenance. A rack may have an open front or a front panel such that personnel may access one or more of the servers stored in the rack. In many cases, a server requiring maintenance will require removal from a rack or otherwise need positioning such that it can be easily accessed for maintenance. For example, sometimes a server cover or panel will require removal for servicing of interior components of the server. Therefore, for at least these reasons, it is desired to provide improved racks for allowing servers to be easily accessed for maintenance.

SUMMARY

Disclosed herein are rack assemblies for server carrying and pivoting. According to an aspect, a rack assembly includes a server rack including multiple stand columns. The server rack defines multiple server spaces for receiving a plurality of servers, and defines an opening for access of the server spaces. The rack assembly also includes first and second slide rails being carried by the stand columns and being configured to move between a first position within a server spaces and a second position that is at least partially outside of the opening.

Further, the rack assembly includes a first connector being configured to releasably attach a first side of the server to the first slide rail. The first side of the server opposes a second side of the server. The rack assembly also includes a second connector configured to attach the second side to the second slide rail, and configured to pivot about the second side when the first side is detached from the second slide rail.

BRIEF DESCRIPTION OF THE DRAWINGS

The illustrated embodiments of the disclosed subject matter will be best understood by reference to the drawings, wherein like parts are designated by like numerals throughout. The following description is intended only by way of example, and simply illustrates certain selected embodiments of devices, systems, and processes that are consistent with the disclosed subject matter as claimed herein.

DETAILED DESCRIPTION

The following detailed description is made with reference to the figures. Exemplary embodiments are described to illustrate the disclosure, not to limit its scope, which is defined by the claims. Those of ordinary skill in the art will recognize a number of equivalent variations in the description that follows.

As referred to herein, the term "rack assembly" should be broadly construed. A rack assembly can be considered to be a frame or enclosure for mounting multiple equipment modules, such as a computing devices (e.g., a server). As an example, a rack assembly may have an interior space for storing equipment modules and define edges that protrude on sides of the interior for allowing the modules to be attached to the rack frame with screws or other suitable fastening equipment. Equipment for placement in a rack assembly is typically described as a rack-mounted system or rack mountable. An industry standard rack cabinet is 42 U tall. Some equipment may be mounted inside a rack via rails (or slides). Typically, for example, a pair of rails is mounted directly onto the rack, and the equipment may then be slid into the rack along the rails, which support it. When in place, the equipment may also then be bolted to the rack. The rails may also be able to fully support the equipment in a position where it has been slid clear of the rack, and this can be useful for inspection or maintenance of equipment which will then be slid back into the interior of the rack.

As referred to herein, the term "computing device" should be broadly construed. For example, the computing device may be any type of conventional computer such as a server, a desktop computer, or a laptop computer. Computing devices may be stored within a rack as described by the examples set forth herein. As an example, a server is typically configured to run an instance of software that is capable of accepting requests from clients, and the computing device that executes such software. Clients may run on the same computer, but typically connect to the server through a network.

Figure 1:
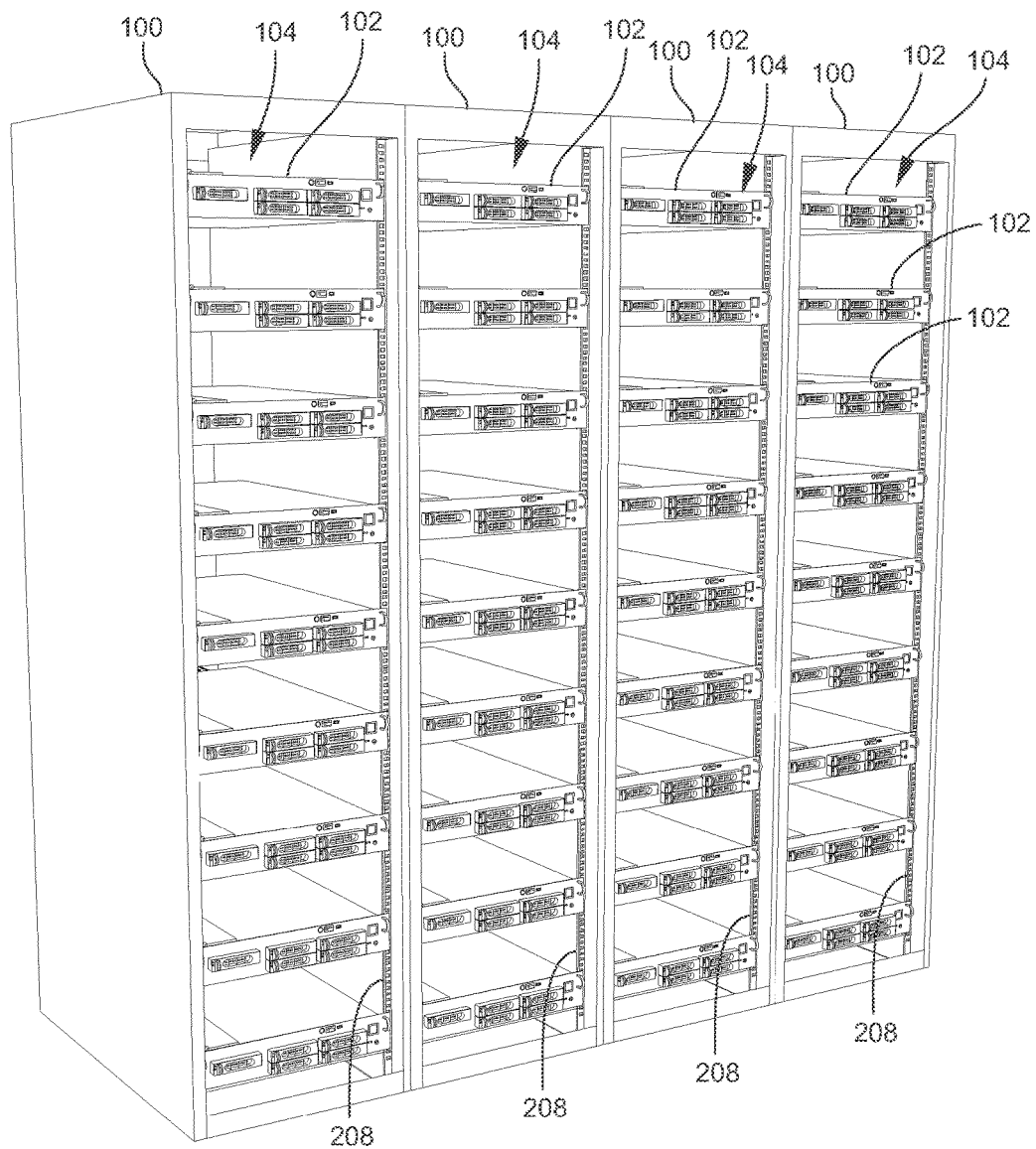
FIG. 1 is a perspective view of multiple, example rack assemblies having components for pivoting servers in accordance with embodiments of the present disclosure.

In accordance with embodiments of the present disclosure, FIG. 1 illustrates a perspective view of multiple, example rack assemblies 100 having components for pivoting servers. Referring to FIG. 1, the rack assemblies 100 are arranged in a row. Each rack assembly 100 defines multiple server spaces in its interior for storage and carry of multiple servers 102. Further, each rack assembly 100 has an opening 104 for access of server spaces and servers 102.

As will be described in further detail herein and shown in the example figures, a rack assembly in accordance with embodiments of the present disclosure, such as the rack assembly 100 shown in FIG. 1, can be used to carry and store servers, and to allow a user, such as an operator or maintenance personnel, to withdraw a server from within its space for servicing or other interaction. When withdrawn from its space in the rack assembly, components of the rack assembly can still support the server while a side of the server is pivoted downward. In this way, the user can be positioned directly in front of the rack assembly being serviced without blocking airflow to other servers or equipment in the rack assembly 100.

Figure 2:
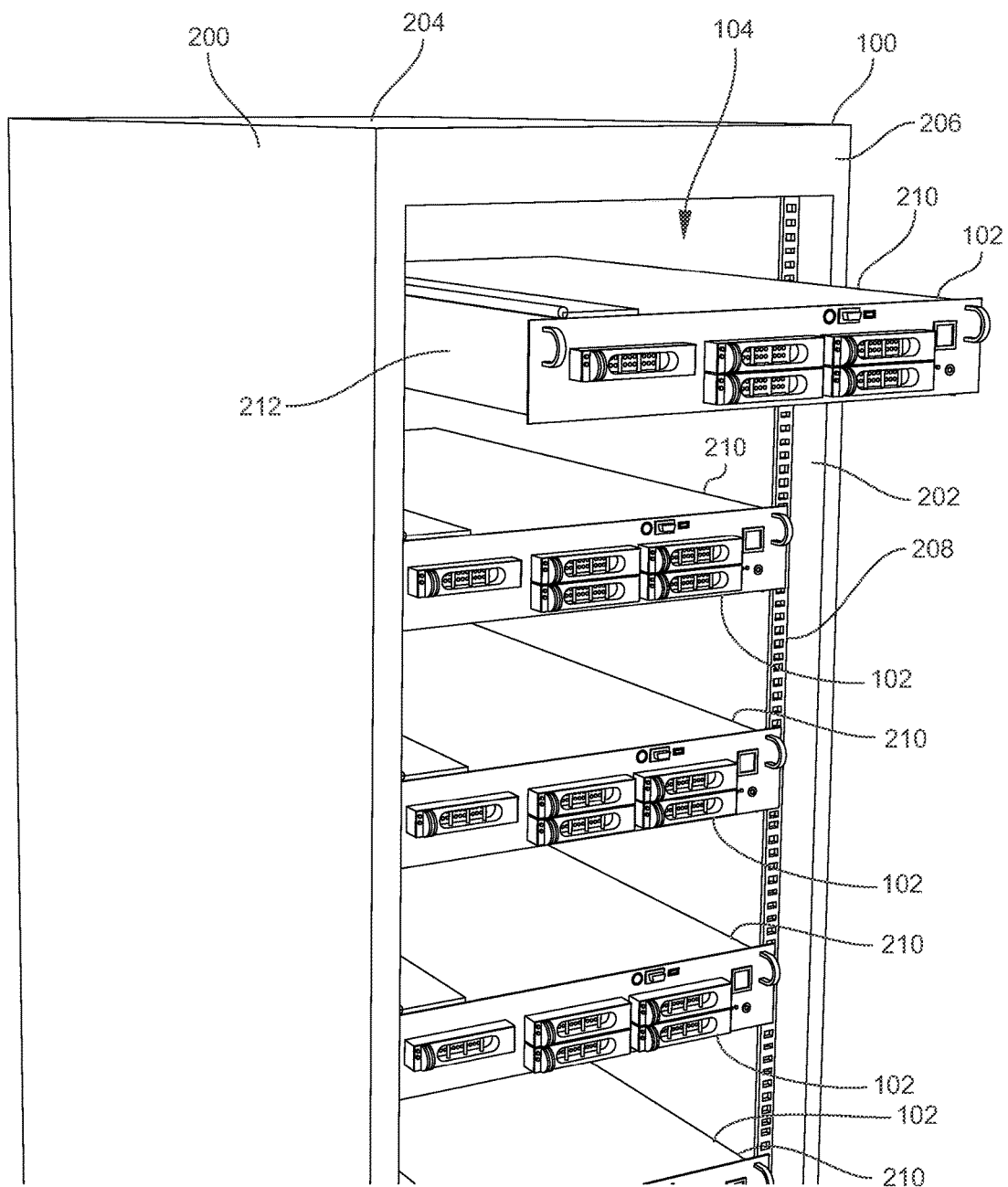
FIG. 2 is a perspective view of a close-up portion of one of the rack assemblies shown in FIG. 1.

FIG. 2 illustrates a perspective view of a close-up portion of one of the rack assemblies 100 shown in FIG. 1. Referring to FIG. 2, the top-most server 102 is shown as being partially withdrawn from its space while the other servers 102 are positioned in their respective spaces for storage in the rack assembly 100. The rack assembly 100 includes side walls 200 and 202, a top 204, and a rear wall (not shown) that are suitably attached together to form a support structure for carrying servers 102. The rack assembly 100 also includes a front wall 206 that defines the opening 104.

The rack assembly 100 includes multiple stand columns 208 (one stand column is shown and the others are hidden from view in FIG. 2). In this example, the stand columns are rigid components that extend along a vertical direction. The stand column 208 shown in FIG. 2 is paired, in this example, with another stand column (not shown) for supporting a right side 210 of servers 102. The shown stand column 208 and its paired stand column are rigidly attach to the side 202 of the rack assembly 100. The paired stand column is also attached to an interior of the side 202 but positioned rearward of the shown stand column 208. The rack assembly 100 also includes another pair of stand columns similarly positioned along an interior of the side wall 200 and attached to the side wall 200 for supporting a left side 212 of servers 102. As will be described in more detail herein, the stand columns 208 work together with other components of the rack assembly 100 for carrying the servers 102.

Figure 3:
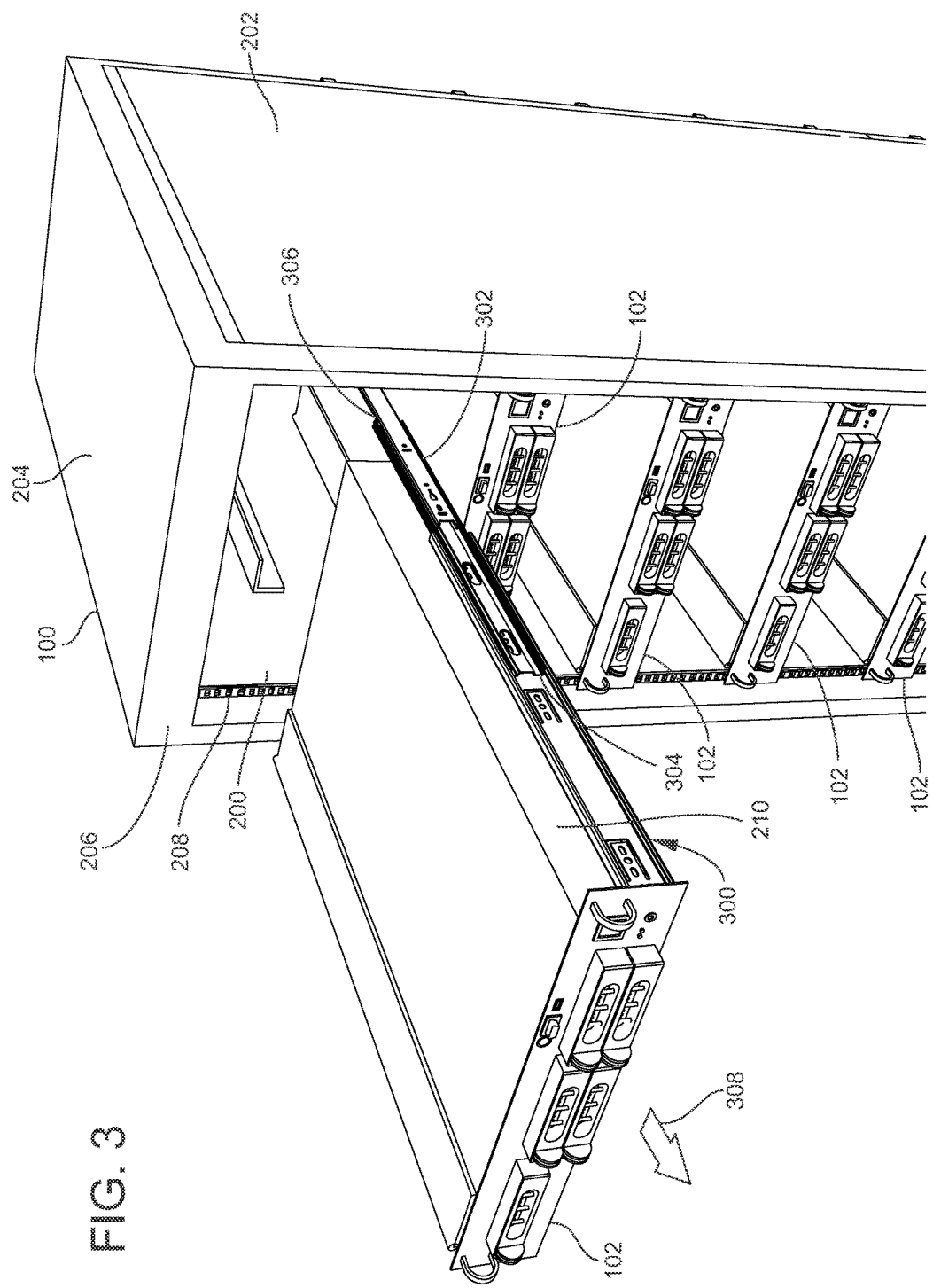
FIG. 3 is a perspective view of a close-up portion of one of the rack assemblies shown in FIG. 1.

FIG. 3 illustrates a perspective view of a close-up portion of one of the rack assemblies 100 shown in FIG. 1. In this figure, the top-most server 102 is shown as being fully withdrawn from its space while the other servers 102 are positioned in their respective spaces within rack assembly 100. FIG. 3 also shows more detail of a mechanism, generally designated 300, for allowing the server to be withdrawn from its space within the rack assembly 100 as shown in the example of FIG. 1 to the position shown in FIG. 3. While in the position shown in FIG. 3, the top-most server 102 can more readily be accessed for maintenance or other user interaction. The other servers 102 shown in FIG. 3 can also be supported by the same or similar-type mechanisms for withdrawal and carry.

The mechanism 300 includes a slide rail 302 attached to the pair of stand columns (not shown) attached to side wall 202. In this way, the stand columns can carry the slide rail 302, which in turn carries the server 102 to which it is attached. The slide rail 302 includes portions 304 and 306 that are configured for movement with respect to each other as will be understood. Particularly, the slide rail portion 304 may be moveably attached to the slide rail portion 306 such that when the server 102 is pulled outward in the direction of arrow 308, slide rail portion 304 will slide over slide rail portion 306. The slide rail portion 304 is attached to the side 210 of the server 102. The slide rail portion 306 is attached to the stand columns that are attached to the interior of side 202.

In addition to the slide rail 302, the rack assembly 100 includes a corresponding slide rail (not shown in FIG. 3) attached to the left side of the server 102 and the stand column pair attached to the interior of side 200. Both slide rails cooperate to hold the sides of the server 102. In this way, the server 102 is carried by the slide rails while in the interior of the rack assembly 100 and to the position shown in FIG. 3.

Figure 4:
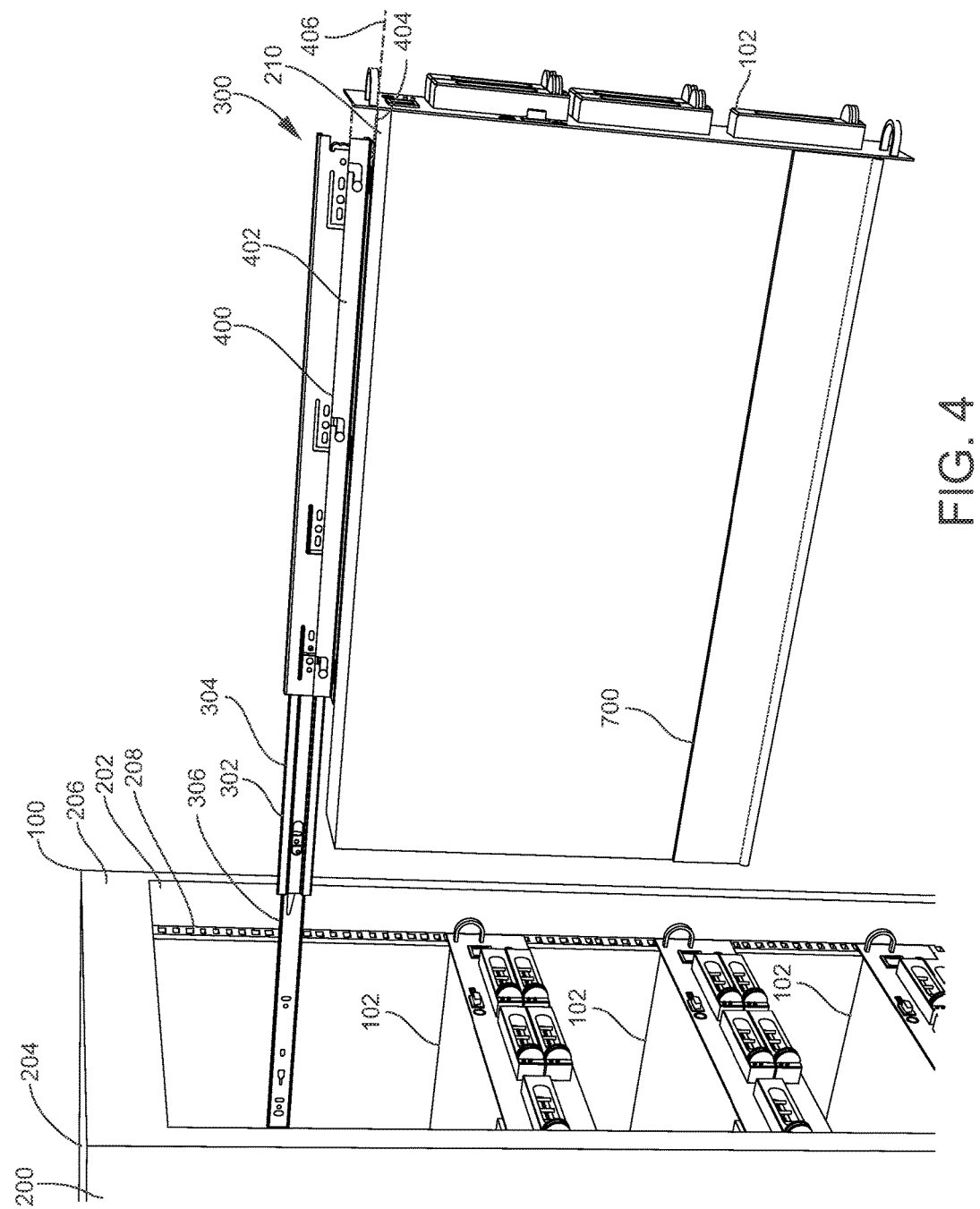
FIG. 4 is a side perspective view of a close-up portion of a rack assembly with a server pivoted downward in accordance with embodiments of the present disclosure.

FIG. 4 illustrates a side perspective view of a close-up portion of a rack assembly 100 with a server 102 pivoted downward in accordance with embodiments of the present disclosure. Referring to FIG. 4, the top-most server 102 has been pivoted downward for facilitating servicing. The rack assembly 100 includes a connector 400 configured to carry the server 102 and to allow the server 102 to pivot downward when the opposing side of the server 102 is released from its other side. In addition, the connector 400 may hold the server 102 while in the position shown in FIG. 4.

The connector 400 includes a first portion 402 and a second portion 404 that are held together by a pin (not shown). The pin can allow the portions 402 and 404 to pivot with respect to each other along an axis designated by broken line 406. When the server 102 is released from the left-side slide rail (not shown in FIG. 4), the server 102 can be rotated downward or pivoted downward about the axis depicted by the broken line 406. Portion 402 can be releasably attached to the slide rail portion 304, and portion 404 can be releasably attached to the side 210 of the server 102.

Figure 5:
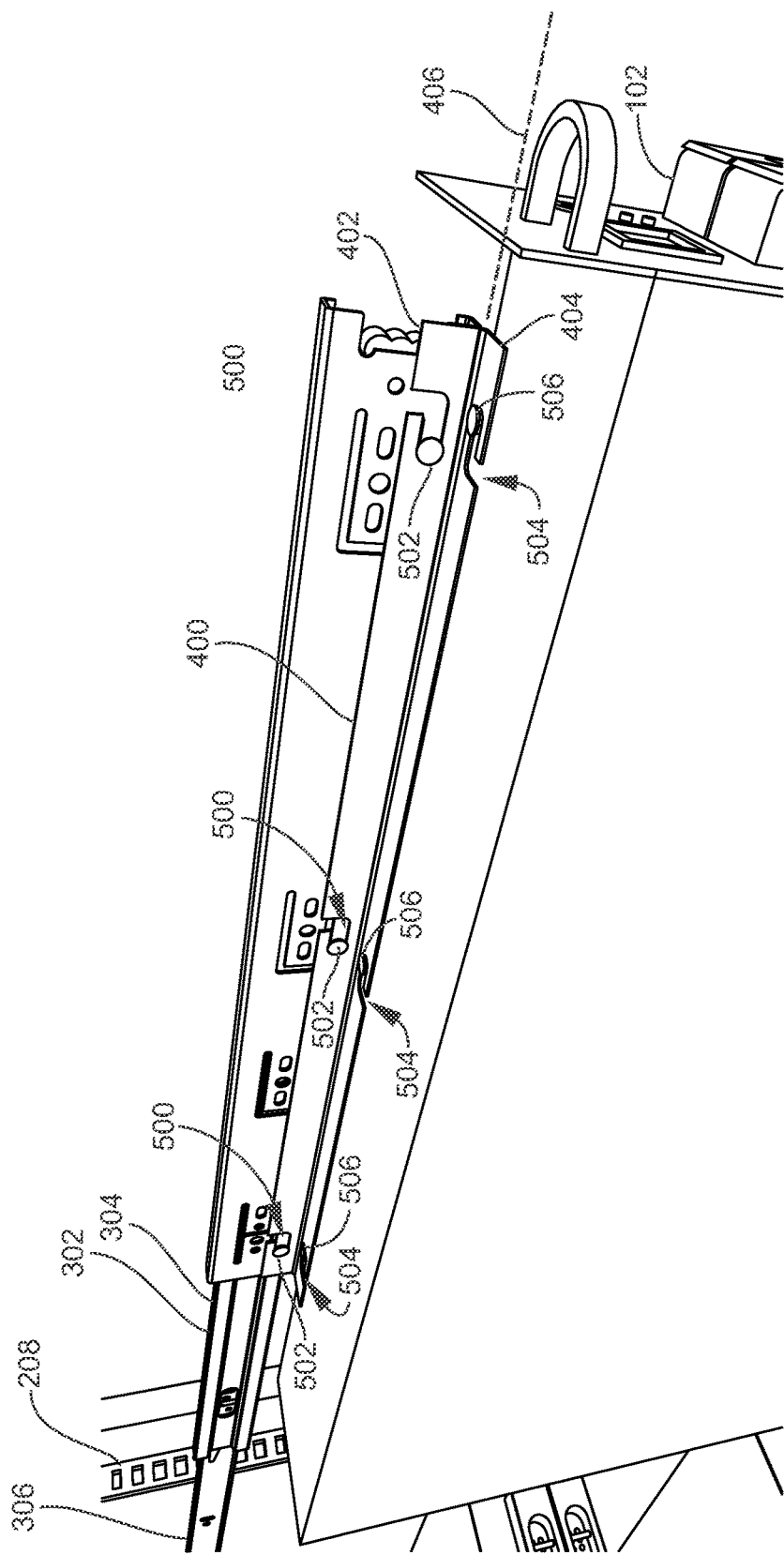
FIG. 5 is a perspective view of a close-up portion of the slide rail and its attached connector for holding a side of a server in accordance with embodiments of the present disclosure.

FIG. 5 illustrates a perspective view of a close-up portion of the slide rail 302 and its attached connector 400 for holding a side of a server in accordance with embodiments of the present disclosure. Referring to FIG. 5, as mentioned, the connector portion 402 is releasably attached to the slide rail portion 304. Particularly, the connector portion 402 defines three (3) curved notches (generally designated 500) that are shaped and sized to accept respective pins 502 that are rigidly attached to the rail slide portion 304. As will be understood, the connector portion 402 and server 102 can be suitably moved leftward and then downward from the position of the server 102 shown in FIG. 5 such that the server 102 is released from being held by the slide rail 302. In this way, the server can be easily removed after being pivoted downward to the position shown in FIG. 5. It is noted that in this example only three notches and pins are shown, but it should be understood that any suitable number and arrangement can be utilized. In addition, it should be understood that any other suitable mechanism may be used for alternatively releasably attaching the server to the rail slide.

With continuing reference to FIG. 5, the connector portion 404 defines notches 504 and corresponding pins 506 attached to the server 102. Similar to the release configuration described for notches 500 and pins 502, the server 102 may be released from connector portion 404.

Figure 6:
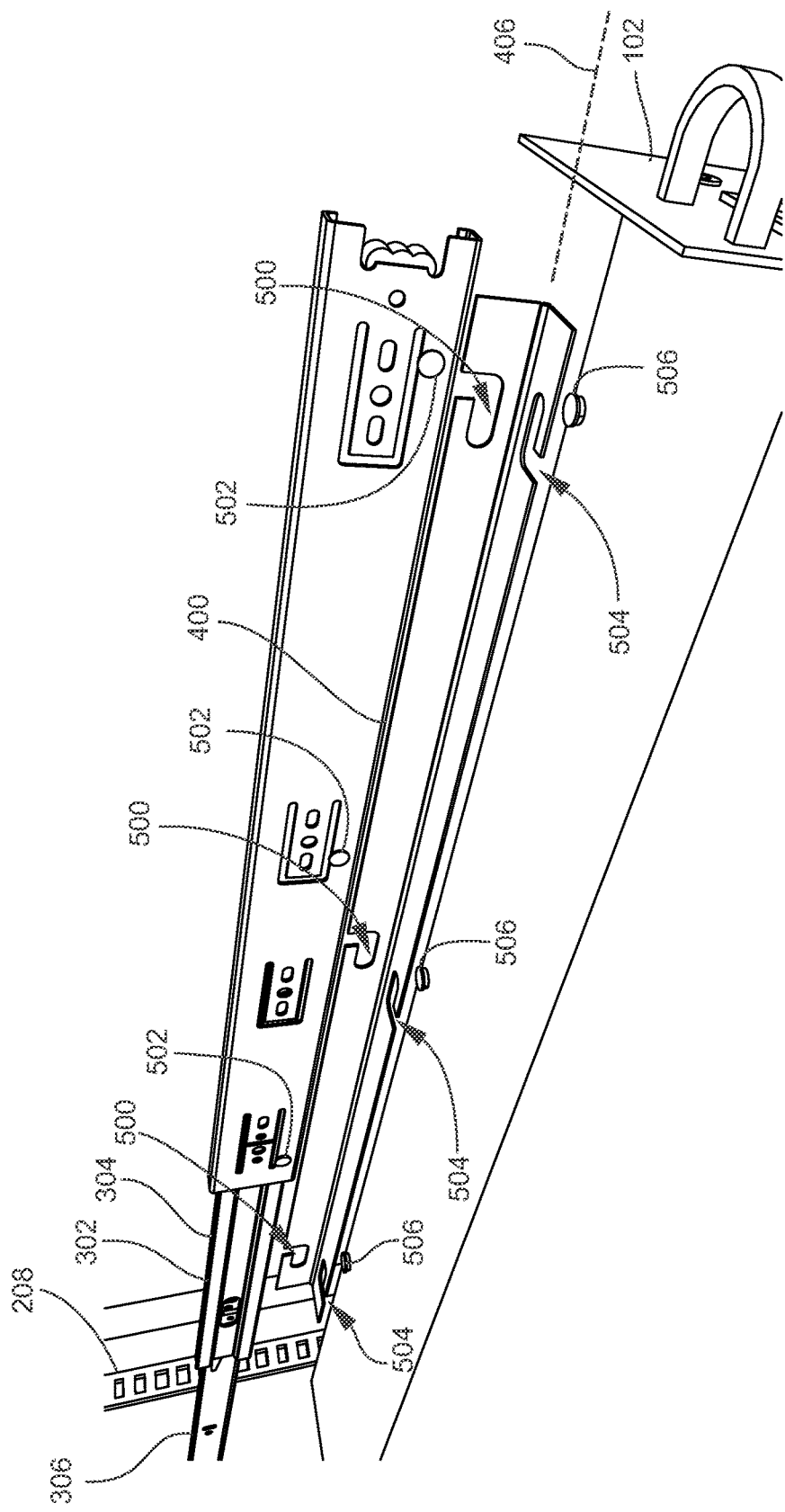
FIG. 6 is a perspective view of another close-up portion of the slide rail and its attached connector for holding a side of a server in accordance with embodiments of the present disclosure.

FIG. 6 illustrates a perspective view of another close-up portion of the slide rail 302 and its attached connector 400 for holding a side of a server in accordance with embodiments of the present disclosure. Referring to FIG. 6, the connector 400, server 102, and slide rail portion 304 are shown as being released from each other such that the server 102 can be removed.

Figure 7:
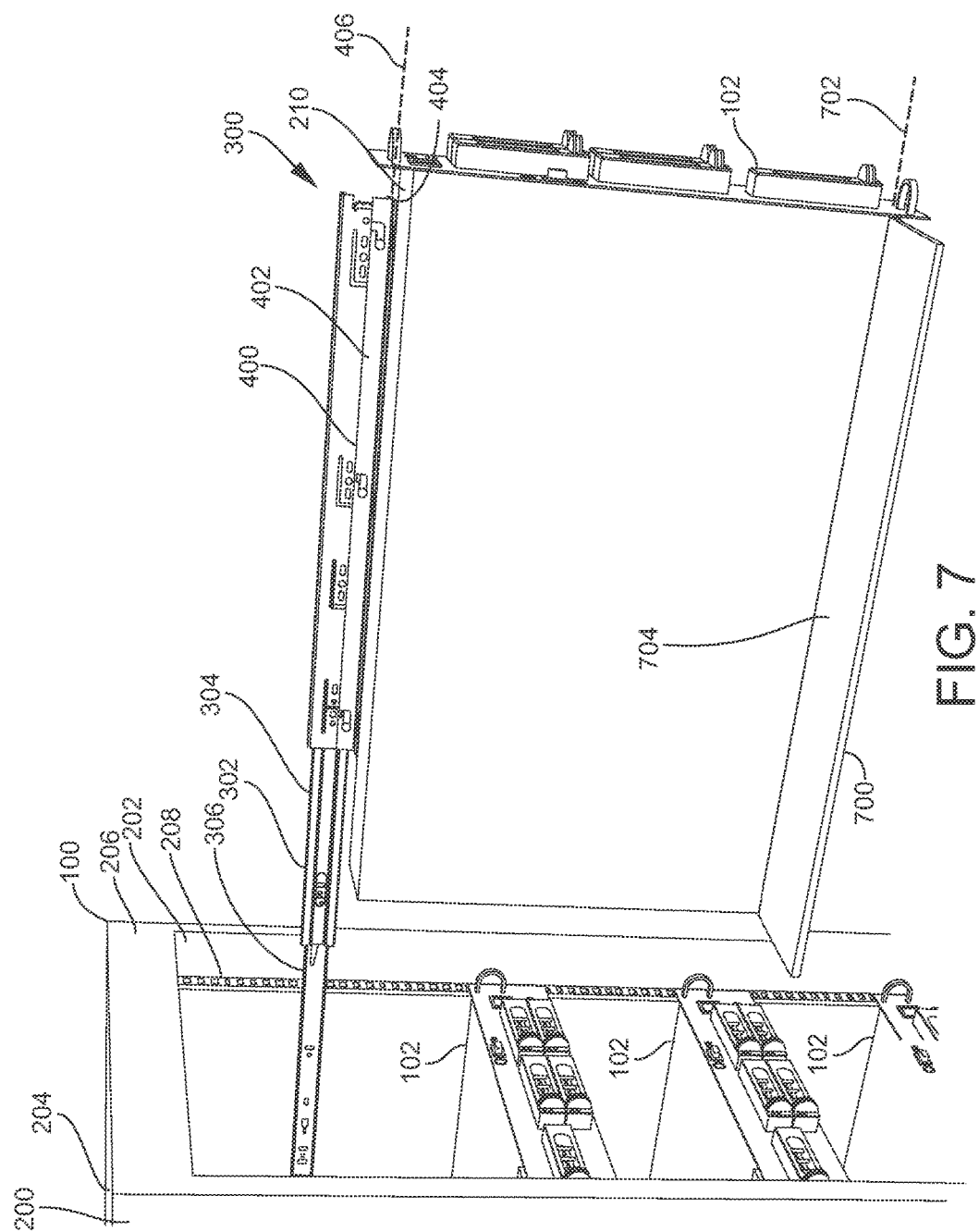
FIG. 7 illustrates a perspective view of another close-up portion of the slide rail and server with a tray for holding items in accordance with embodiments of the present disclosure.

FIG. 7 illustrates a perspective view of another close-up portion of the slide rail 302 and server 102 with a tray 700 for holding items in accordance with embodiments of the present disclosure. Referring to FIG. 7, the tray 700 is pivotally attached to the side of the server 102 as shown. More particularly, the tray 700 may pivot about an axis that extends along broken line 702. The tray 700 is configured to be movable between the position shown in FIG. 7 and the position shown in FIG. 4. In the position shown in FIG. 4, the tray 700 is adjacent to a top of the server 102. In the position shown in FIG. 7, the tray 700 is positioned away from the top of the server 102. In this way, when the server 102 is positioned downward as shown in FIG. 7, the tray provides a surface 704 for holding items, such as tools and equipment for servicing of the server 102.

Figure 8:
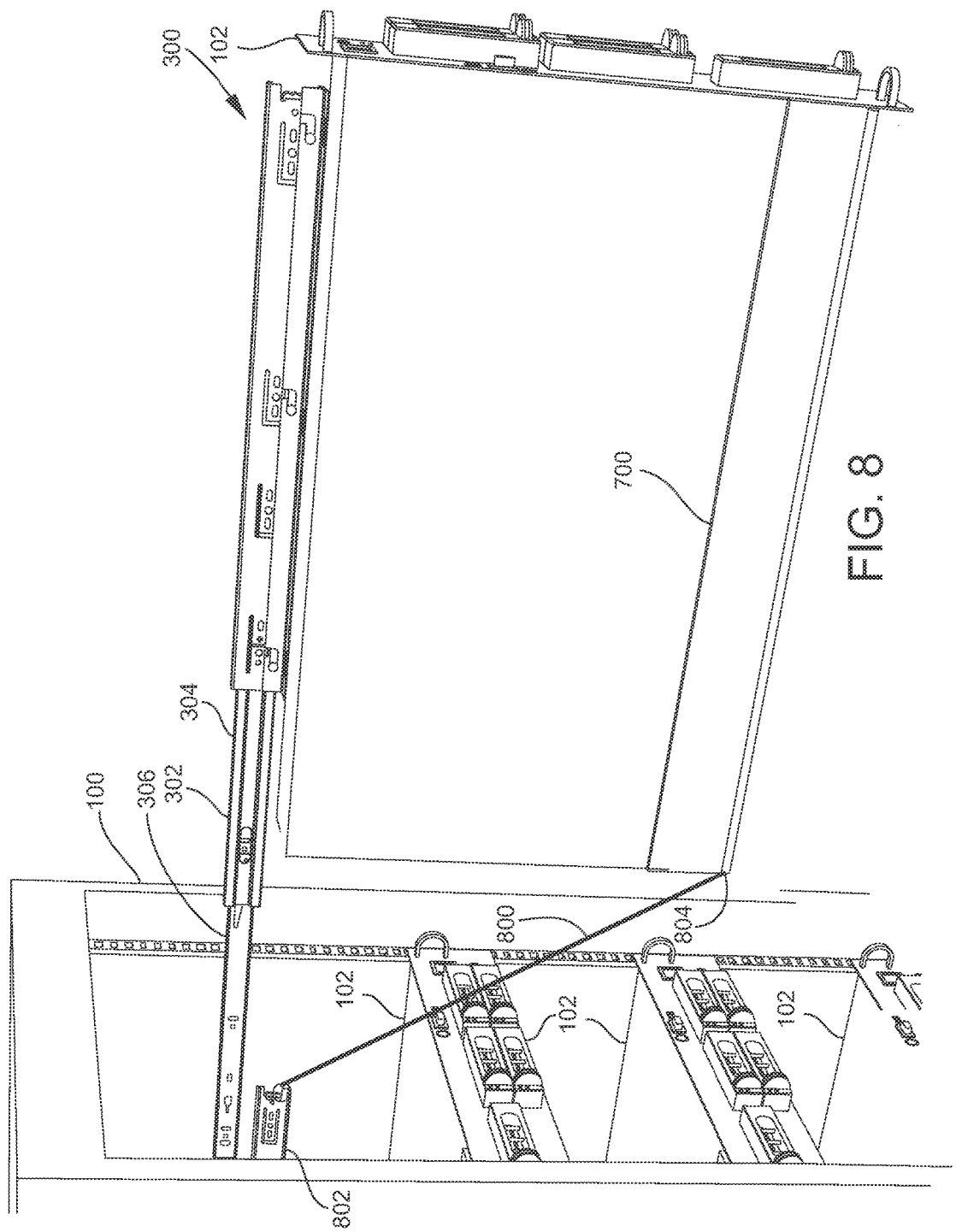
FIG. 8 is a perspective view of another close-up portion of a slide rail configured with a cable for supporting a server during release from the slide rail in accordance with embodiments of the present disclosure.

FIG. 8 illustrates a perspective view of another close-up portion of a slide rail 802 configured with a cable 800 for supporting a server 102 during release from the slide rail 802 in accordance with embodiments of the present disclosure. Referring to FIG. 8, the cable 800 can be attached to a slide rail 802 and at its opposing end to a cable attachment point 804 of the server 102 for supporting the server 102 when the left side of the server 102 is released from the slide rail 802. The end of the cable that opposed the end attached to the server 102 can be connected to a suitable resistance mechanism (not shown) that resists pull of the cable 800 towards the server 102. For example, the resistance mechanism can be a spring, a clutch, or any other suitable mechanism. In this way, when the server 102 is released from slide rail 802, the server 102 can be gently pivoted downward from the position attached to the slide rail 802 to the position shown in FIG. 8.

Figure 9:
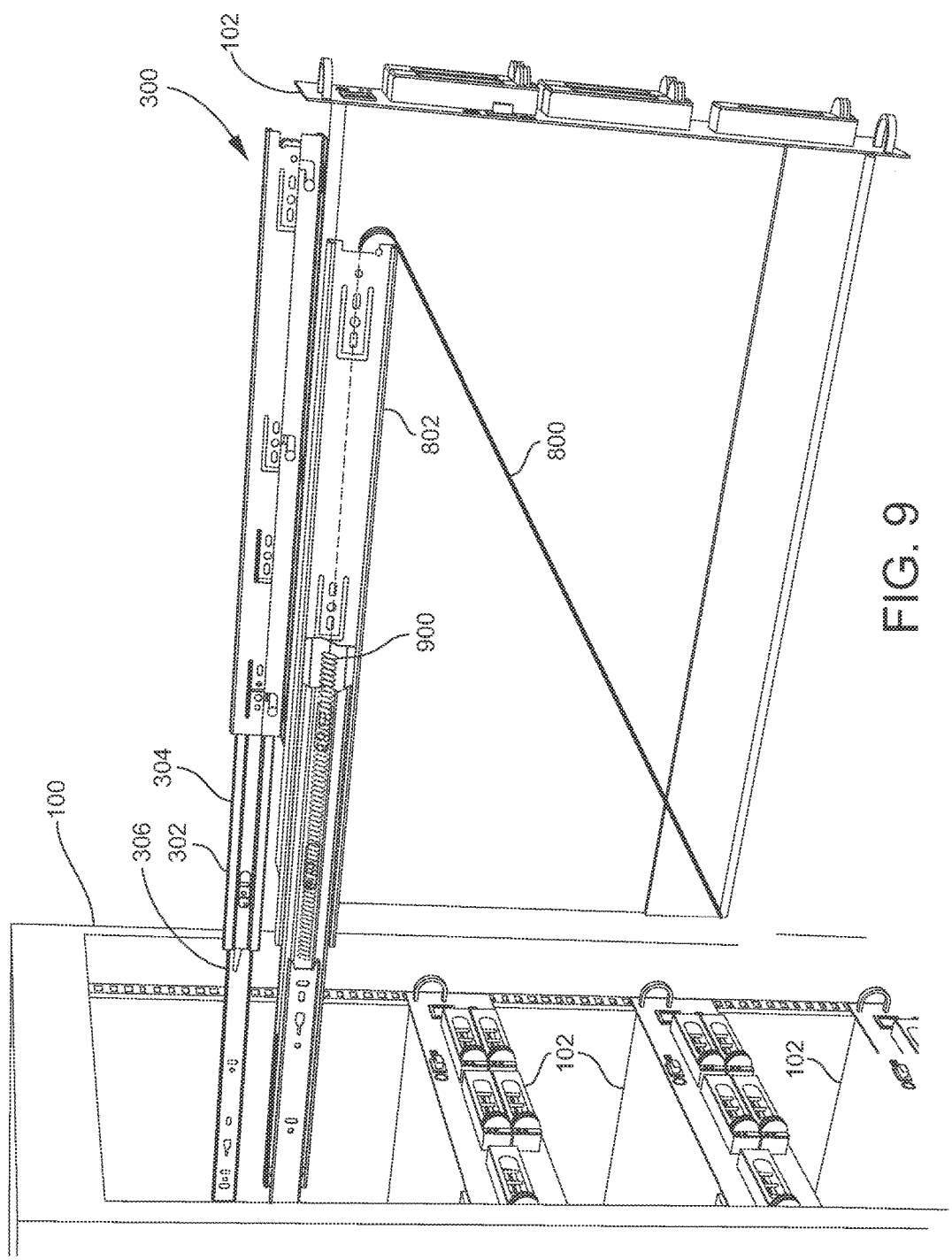
FIG. 9 is another perspective view of the slide rail and cable shown in FIG. 8.

FIG. 9 illustrates another perspective view of the slide rail 802 and cable 800 shown in FIG. 8. Referring the FIG. 9, the slide rail 802 is shown as being extended. In this example, the resistance mechanism is a spring 900. The spring 900 and a portion of the cable 800 attached thereto are positioned within an interior defined by the slide rail 802. In this figure, a portion of the slide rail 802 depicted as broken away to show placement of the spring 900 and cable 800 therein. It is also noted that the slide rail 802 may be retracted or slid back to the position shown in FIG. 8 for avoiding interference by the slide rail 802 and cable 800 during service activity.

Figure 10:
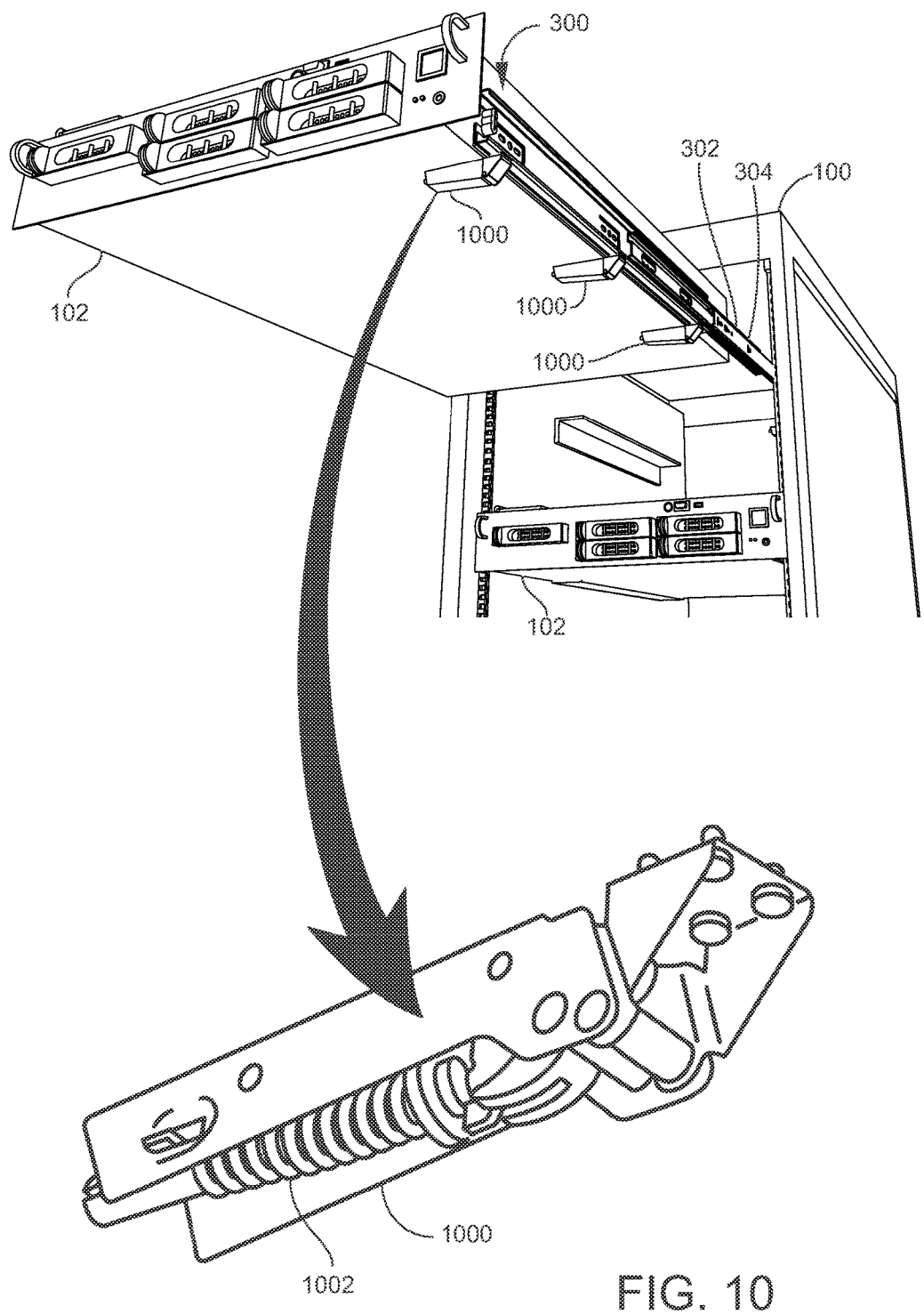
FIG. 10 is a perspective view of an underside of one of the servers in a rack assembly including resistive hinges in accordance with embodiments of the present disclosure.

FIG. 10 illustrates a perspective view of an underside of one of the servers 102 in a rack assembly 100 including resistive hinges 1000 in accordance with embodiments of the present disclosure. Referring to FIG. 10, the resistive hinges 100 are each attached to an underside of the top-most server 102 and the slide rail 302 for resisting movement of the top-most server 102 when pivoting the server 102 downward as described herein. A close-up of an example resistive hinge 1000 is shown at the bottom of FIG. 10. As shown, the resistive hinge 1000 may include a spring mechanism 1002 configured to resist movement of the one of the servers when pivoting about the second side.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A rack assembly comprising:
   a server rack comprising a plurality of stand columns, defining a plurality of server spaces for receiving a plurality of servers, and defining an opening for access of the server spaces;
   a first slide rail and a second slide rail supported by the stand columns and which move between a first position within one of the server spaces and a second position that is at least partially outside of the opening;
   a first connector that releasably attaches a first side of one of the servers to the first slide rail, wherein the first side of the one of the servers opposes a second side of the one of the servers;
   a second connector that:
      attaches the second side of the one of the servers to the second slide rail, and
      pivots around the second side when the first side is detached from the first slide rail; and
      a cable and resistance mechanism, wherein the cable is attached at a first end to the resistance mechanism and the first slide rail,
      wherein the cable is attached at a second end to an end of the one of the servers, and
      wherein the cable and resistance mechanism resist a force pulling the cable in a direction of attachment to the end of the one of the servers.

2. The rack assembly of claim 1, wherein each of the server spaces is 1 U in height.

3. The rack assembly of claim 1, wherein the first and second slide rails each comprise first and second portions, the first portion of each of the slide rails being attached to the stand columns, and the second portion of the first slide rail and the second slide rail being engaged with and moves with respect to the first portion of the first slide rail and the second slide rail, respectively, wherein the second portion of the first slide rail is attached to the first connector, and wherein the second portion of the second slide rail is attached to the second connector.

4. The rack assembly of claim 1, wherein the second portion of the slide rails are moveable to the second position such that the one of the servers is outside of the one of the server spaces.

5. The rack assembly of claim 1, further comprising side walls, a rear wall, and a front being attached together to form a support structure for carrying servers.

6. The rack assembly of claim 5, wherein the front defines the opening.

7. The rack assembly of claim 5, wherein the stand columns are rigidly attached to the side walls.

8. The rack assembly of claim 1, wherein the stand columns include first, second, third, and fourth stand columns.

9. The rack assembly of claim 1, wherein the first connector comprises a latch mechanism for securing the first side of the one of the servers to the first slide rail.

10. The rack assembly of claim 1, wherein the second connector comprises first and second portions, the first portion being connected to a second side of the second slide rail, and the second portion connects to a first side of the first slide rail.

11. The rack assembly of claim 1, wherein the server spaces are arranged in a vertical direction with respect to each other.

12. The rack assembly of claim 1, wherein the resistance mechanism comprises one of a spring and clutch.

13. The rack assembly of claim 1, wherein the first slide rail defines an interior, and wherein the resistance mechanism and a portion of the cable are positioned within the interior of the first slide rail.

14. The rack assembly of claim 1, further comprising at least one resistive hinge attached to a second side of the second slide rail and the one of the servers for resisting movement of the one of the servers when pivoting about the second side.

15. The rack assembly of claim 14, wherein the resistive hinge comprises a spring mechanism that resists movement of the one of the servers when pivoting about the second side.

16. A rack assembly comprising:
- a server rack comprising a plurality of stand columns, defining a plurality of server spaces for receiving a plurality of servers, and defining an opening for access of the server spaces;
- first and second slide rails supported by the stand columns and that moves between a first position within one of the server spaces and a second position that is at least partially outside of the opening;
- a first connector that releasably attaches a first side of one of the servers to the first slide rail, wherein the first side of the one of the servers opposes a second side of the one of the servers;
- a second connector that attaches the second side to the second slide rail, and that pivots about the second side when the first side is detached from the second slide rail; and
- a tray attached to the first side of the one of the servers.

17. The rack assembly of claim 16, wherein the tray is pivotally attached to the first side of the one of the servers.

18. The rack assembly of claim 16, wherein the tray is movable between a first position and a second position, wherein in the first position the tray is adjacent to a top of the one of the servers, and wherein in the second position the tray is positioned away from the top of the one of the servers.

19. The rack assembly of claim 18, wherein when the one of the servers is pivoted downward about the second side, the tray is moveable to the second position for holding components.

\* \* \* \* \*